US009123750B2

(12) United States Patent
Park et al.

(10) Patent No.: US 9,123,750 B2
(45) Date of Patent: Sep. 1, 2015

(54) TRANSISTORS INCLUDING A CHANNEL WHERE FIRST AND SECOND REGIONS HAVE LESS OXYGEN CONCENTRATION THAN A REMAINING REGION OF THE CHANNEL, METHODS OF MANUFACTURING THE TRANSISTORS, AND ELECTRONIC DEVICES INCLUDING THE TRANSISTORS

(71) Applicant: Samsung Electronics Co., Ltd., Suwon-Si, Gyeonggi-Do (KR)

(72) Inventors: Joon-seok Park, Yongin-si (KR); Sun-jae Kim, Seoul (KR); Tae-sang Kim, Seoul (KR); Hyun-suk Kim, Hwaseong-si (KR); Myung-kwan Ryu, Yongin-si (KR); Seok-jun Seo, Anyang-si (KR); Jong-baek Seon, Yongin-si (KR); Kyoung-seok Son, Seoul (KR); Sang-yoon Lee, Seoul (KR)

(73) Assignees: Samsung Electronics Co., Ltd., Gyeonggi-do (KR); Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/016,599

(22) Filed: Sep. 3, 2013

(65) Prior Publication Data

US 2014/0159035 A1  Jun. 12, 2014

(30) Foreign Application Priority Data

Dec. 10, 2012  (KR) .................. 10-2012-0143031

(51) Int. Cl.
*H01L 29/10* (2006.01)
*H01L 29/66* (2006.01)
*H01L 29/786* (2006.01)

(52) U.S. Cl.
CPC ...... *H01L 29/66969* (2013.01); *H01L 29/7869* (2013.01); *H01L 29/78618* (2013.01)

(58) Field of Classification Search
CPC . H01L 29/66; H01L 29/786; H01L 29/66969; H01L 29/78618; H01L 29/7869; H01L 29/66765; H01L 27/1225; H01L 21/823807; H01L 27/1214; H01L 21/3003; H01L 29/4908; H01L 27/13
USPC .......................................................... 257/43
See application file for complete search history.

(56) References Cited

U.S. PATENT DOCUMENTS

| 6,235,640 | B1 | 5/2001 | Ebel et al. |
| 7,923,722 | B2 * | 4/2011 | Ryu et al. ............. 257/43 |
| 8,021,916 | B2 | 9/2011 | Akimoto et al. |
| 2004/0198046 | A1 | 10/2004 | Yu-Chou et al. |

(Continued)

FOREIGN PATENT DOCUMENTS

KR          100384849          6/2002

OTHER PUBLICATIONS

European Search Report for corresponding European application No. 13 195 425.7 dated Mar. 17, 2014.

*Primary Examiner* — Thanh T Nguyen
(74) *Attorney, Agent, or Firm* — Harness, Dickey & Pierce, P.L.C.

(57) ABSTRACT

According to example embodiments, a transistor may include a gate electrode, a gate insulating layer, and a channel layer stacked on each other; and a source electrode and a drain electrode contacting first and second regions of the channel layer, respectively. The channel layer may include metal oxynitride. The first and second regions of the channel layer may be treated with a plasma containing hydrogen, and the first and second regions have a higher carrier concentration than a carrier concentration of a remaining region of the channel layer. The first and second regions of the channel layer may have a lower oxygen concentration and a higher nitrogen concentration than that of the remaining region thereof. The metal oxynitride of the channel layer may include a zinc oxynitride (ZnON)-based semiconductor.

9 Claims, 11 Drawing Sheets

(56) References Cited

U.S. PATENT DOCUMENTS

| | | |
|---|---|---|
| 2010/0213460 A1 | 8/2010 | Kondo et al. |
| 2012/0003795 A1 | 1/2012 | Noda |
| 2012/0161123 A1* | 6/2012 | Yamazaki ............... 257/43 |
| 2012/0228605 A1 | 9/2012 | Noda |

* cited by examiner

< Annealing (1) >

< Annealing (2) >

TRANSISTORS INCLUDING A CHANNEL WHERE FIRST AND SECOND REGIONS HAVE LESS OXYGEN CONCENTRATION THAN A REMAINING REGION OF THE CHANNEL, METHODS OF MANUFACTURING THE TRANSISTORS, AND ELECTRONIC DEVICES INCLUDING THE TRANSISTORS

CROSS-REFERENCE TO RELATED APPLICATION

This application claims priority under 35 U.S.C. §119 to Korean Patent Application No. 10-2012-0143031, filed on Dec. 10, 2012, in the Korean Intellectual Property Office, the disclosure of which is incorporated herein in its entirety by reference.

BACKGROUND

1. Field

Example embodiments relate to transistors, methods of manufacturing transistors, and electronic devices including transistors.

2. Description of the Related Art

Transistors have been widely used as switching devices or driving devices for electronic appliances. In particular, since thin film transistors may be fabricated on glass or plastic substrates, they have versatile applications in the field of flat panel displays, such as liquid crystal displays (LCDs) or organic light-emitting displays (OLEDs).

In order to improve the operating characteristics of a transistor, using an oxide layer with a high carrier mobility as a channel layer has been attempted. This approach may be applied to a thin film transistor for a flat panel display device.

SUMMARY

Example embodiments relate to transistors including a channel layer containing oxynitride semiconductor.

Example embodiments relate to oxynitride thin-film transistors having excellent performance and operating characteristics.

Example embodiments relate to transistors having a low contact resistance between the channel layer and source/drain electrodes.

Example embodiments relate to methods of manufacturing transistors.

Example embodiments relate to electronic devices (e.g., flat panel displays) including the transistors.

Additional aspects will be set forth in part in the description that follows and, in part, will be apparent from the description, or may be learned by practice of example embodiments.

According to example embodiments, a transistor includes: a gate electrode, a gate insulating layer, and a channel layer stacked on each other, the channel layer facing the gate electrode, the channel layer including metal oxynitride, the channel layer including first and second regions that are plasma treated regions and have a higher carrier concentration than a carrier concentration in a remaining region of the channel layer, the gate insulating layer between the channel layer and the gate electrode; and a source electrode and a drain electrode contacting the first and second regions of the channel layer, respectively.

In example embodiments, the first and second regions of the channel layer may be treated with a plasma containing hydrogen.

In example embodiments, the first and second regions of the channel layer may contain hydrogen.

In example embodiments, an oxygen concentration of first and second regions of the channel layer may be less than an oxygen concentration of the remaining region of the channel layer.

In example embodiments, a nitrogen concentration of the first and second regions of the channel layer may be higher than a nitrogen concentration of the remaining region thereof.

In example embodiments, the metal oxynitride of the channel layer may include a zinc oxynitride (ZnON)-based semiconductor.

In example embodiments, the ZnON-based semiconductor may further include an element X. The element X may include at least one of at least one cation, at least one anion, and a combination of the at least one cation and the at least one anion. The at least one cation may include at least one of Boron (B), aluminum (Al), gallium (Ga), indium (In), tin (Sn), titanium (Ti), zirconium (Zr), hafnium (Hf) and silicon (Si). The at least one anion may include at least one of fluorine (F), chlorine (Cl), bromine (Br), iodine (I), sulphur (S) and selenium (Se).

In example embodiments, the transistor may further include an etch stop layer on the channel layer. The first and second regions of the channel layer may be located at both sides of the etch stop layer, respectively.

In example embodiments, the gate electrode may be below the channel layer.

In example embodiments, the gate electrode may be above the channel layer.

According to example embodiments, a flat panel display device may include the transistor.

In example embodiments, the flat panel display device may be a liquid crystal display device or an organic light-emitting display device.

In example embodiments, the transistor may be used as a switching element or a driving element.

According to example embodiments, a method of manufacturing a transistor includes: forming a channel layer including metal oxynitride; performing a plasma treatment on first and second regions of the channel layer; forming a source electrode contacting the first region and a drain electrode contacting the second region; and forming a gate electrode coupled to the channel layer.

In example embodiments, the performing the plasma treatment may include using a hydrogen-containing gas.

In example embodiments, the hydrogen-containing gas may include one of ammonia ($NH_3$), hydrogen ($H_2$), silane ($SiH_4$), and a mixture thereof.

In example embodiments, the plasma treatment may be performed at about 20° C. to about 350° C.

In example embodiments, the metal oxynitride of the channel layer may include a ZnON-based semiconductor.

In example embodiments, the ZnON-based semiconductor may further include an element X. The element X may include at least one of at least one cation, at least one anion, and a combination thereof. The at least one cation may include at least one of B, Al, Ga, In, Sn, Ti, Zr, Hf and Si. The at least one anion may include at least one of F, Cl, Br, I, S and Se.

In example embodiments, the forming the channel layer may include a reactive sputtering process.

In example embodiments, the reactive sputtering process may use one of: a single Zn target, a first target containing Zn and a second target containing the element X, and a target containing both Zn and the element X.

In example embodiments, the reactive sputtering process may include using oxygen ($O_2$) and nitrogen ($N_2$) gases as reactive gases.

In example embodiments, the reactive sputtering process may include using argon (Ar).

In example embodiments, a flow rate of the $O_2$ gas in the reactive sputtering process may be in the range of about 1 to about 15 sccm.

In example embodiments, a flow rate of the $N_2$ gas in the reactive sputtering process may be in the range of about 20 to about 200 sccm.

In example embodiments, a flow rate of the Ar gas in the reactive sputtering process may be in the range of about 1 to about 100 sccm.

In example embodiments, the reactive sputtering process may be performed at about 25° C. to about 300° C.

In example embodiments, the method may further include: annealing the channel layer at about 150° C. to about 350° C. before the performing of the plasma treatment on the first and second regions of the channel layer.

In example embodiments, the method may further include forming an etch stop layer on the channel layer, and the first and second regions of the channel layer may be defined by the etch stop layer.

In example embodiments, the gate electrode may be disposed below the channel layer.

In example embodiments, the gate electrode may be disposed above the channel layer.

According to example embodiments, a method of manufacturing a transistor includes: forming a channel layer including metal oxynitride, the channel layer including a first and a second region having a higher carrier concentration than a carrier concentration of a remaining region of the channel layer between the first and second regions; forming a source electrode contacting the first region and a drain electrode contacting the second region; and forming a gate insulating layer and a gate electrode coupled to the channel layer, the gate insulating layer between the channel layer and the gate electrode.

In example embodiments, the metal oxynitride of the channel layer may include a zinc oxynitride (ZnON)-based semiconductor.

In example embodiments, the method may further include forming a layer on the channel layer. The layer may expose portions at both sides of the channel layer corresponding to the first and second regions. The forming the channel layer may include performing a plasma treatment on the channel layer using a hydrogen-containing gas and the layer as a mask.

In example embodiments, the layer may be an etch stop layer. The etch stop layer may include one of silicon oxide, silicon nitride, and an organic insulating material.

In example embodiments, the forming the gate electrode may include forming the gate electrode on a substrate, and the forming the gate insulating layer may include forming the gate insulating layer on one of the gate electrode and the channel layer.

BRIEF DESCRIPTION OF THE DRAWINGS

These and/or other aspects will become apparent and more readily appreciated from the following description of non-limiting embodiments, taken in conjunction with the accompanying drawings. The drawings are not necessarily to scale, emphasis instead being placed upon illustrating principles of inventive concepts. In the drawings.

DETAILED DESCRIPTION

Figure 1:
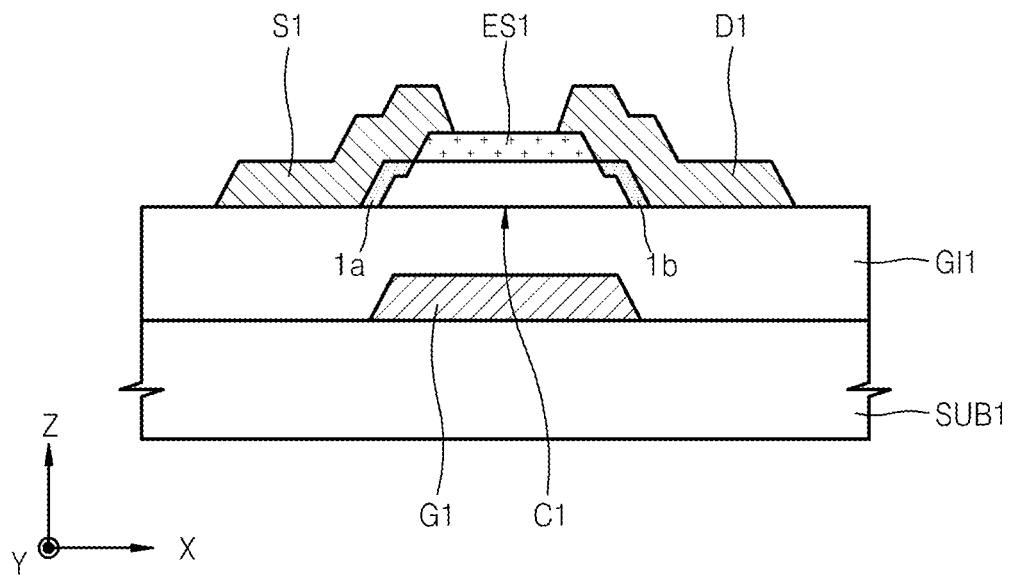
FIGS. 1 through 5 are cross-sectional views of transistors according to example embodiments.

Example embodiments will now be described more fully with reference to the accompanying drawings in which example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a transistor according to example embodiments. The transistor in FIG. 1 may be a thin film transistor having a bottom gate structure in which a gate electrode G1 is disposed below a channel layer C1.

Referring to FIG. 1, the gate electrode G1 may be disposed on a substrate SUB1. The substrate SUB1 may be a glass substrate, a plastic substrate, or a semiconductor substrate (e.g., a silicon substrate). However, example embodiments are not limited thereto and other substrates which are commonly used in semiconductor manufacturing processes may be used. The gate electrode G1 may be formed of a general electrode material such as a metal or a conductive oxide (e.g., ITO, IZO, AZO, GZO, ZTO, or SnO). A gate insulating layer GI1 may be disposed on the substrate SUB1 so as to cover the gate electrode G1. The gate insulating layer GI1 may include a silicon oxide layer, a silicon oxynitride layer, or a silicon nitride layer. The gate insulating layer GI1 may also include other material layers such as a high dielectric constant material layer (e.g., an aluminum oxide film, a hafnium oxide film, etc.) with a dielectric constant that is higher than a dielectric constant of silicon nitride. The gate insulating layer GI1 may be formed from a stack of at least two of the silicon oxide layer, the silicon oxynitride layer, the silicon nitride layer, and the high dielectric constant material layer.

The channel layer C1 may be disposed on the gate insulating layer GI1. The channel layer C1 may be above the gate electrode G1, so as to face the gate electrode G1. A width of the channel layer C1 in an X-axis direction may be approximately equal to or greater than a width of the gate electrode G1 in the X-axis direction. However, example embodiments are not limited thereto, and the width of the channel layer C1 may be less than the width of the gate electrode G1. The channel layer C1 may include a metal oxynitride semiconductor, e.g., a zinc oxynitride (ZnON)-based semiconductor. For example, the channel layer C1 may be formed of ZnON or ZnON—X (X: additional element). The additional element X may contain at least one of cations of boron (B), aluminum (Al), gallium (Ga), indium (In), tin (Sn), titanium (Ti), zirconium (Zr), hafnium (Hf) and silicon (Si), or contain at least one of anions of fluorine (F), chlorine (Cl), bromine (Br), iodine (I), sulphur (S) and selenium (Se), or contain at least one of the cations and at least one of the anions. Some examples of ZnON—X containing the at least one cation are ZnON—Al, ZnON—Ga, ZnON—Hf, and ZnON—Si. Some examples of ZnON—X containing the at least one anion are ZnON—F and ZnON—Cl. The additional element X in the ZnON—X may be a dopant. The metal oxynitride semiconductor of the channel layer C1 may be amorphous or crystalline, or may have a structure including a mixture of amorphous and crystalline phases. The channel layer C1 may have a thickness in the range of about 5 nm to about 150 nm, and/or a range of about 10 nm to about 100 nm. However, such a thickness range of the channel layer C1 may vary.

A source electrode S1 and a drain electrode D1 may be in contact with the channel layer C1. The source electrode S1 and the drain electrode D1 may contact a first region 1a and a second region 1b of the channel layer C1, respectively. The first and second regions 1a and 1b may be one end and the other end of the channel layer C1. The source and drain electrodes S1 and D1 may be formed of the same material as or different materials than the gate electrode G1. Each of the source and drain electrodes S1 and D1 may have a single- or multi-layer structure. For example, each of the source and drain electrodes S1 and D1 may include a metal such as aluminum (Al), neodymium (Nd), chromium (Cr), copper (Cu), tantalum (Ta), titanium (Ti), molybdenum (Mo), tungsten (W), gold (Au) or silver (Ag), and an alloy thereof. Alternatively, the source or drain electrode S1 or D1 may include a transparent conductive oxide (TCO) such as indium tin oxide (In—Sn—O; ITO), indium zinc oxide (In—Zn—O; IZO), aluminum zinc oxide (Al—Zn—O; AZO), gallium zinc oxide (Ga—Zn—O; GZO) and zinc tin oxide (Zn—Sn—O; ZTO), or an alloy thereof. The shape and location of the source and drain electrodes S1 and D1 may vary.

The first and second regions 1a and 1b of the channel layer C1 respectively contacting the source electrode S1 and the drain electrode D1 may be 'plasma treated regions'. For example, the first and second regions 1a and 1b may be treated with plasma containing hydrogen. The plasma containing hydrogen (e.g., hydrogen-containing plasma) may mean 'plasma of a gas including hydrogen'. The first and second regions 1a and 1b treated with the plasma may contain hydrogen atoms. The hydrogen atoms may function as a carrier donor so that a carrier concentration of the first and second regions 1a and 1b may increase. The first and second regions 1a and 1b of the channel layer C1 may have a lower oxygen concentration than that of the remaining region thereof. In other words, the first and second regions 1a and 1b may have a lower oxygen content than that of the remaining region. Thus, the first and second regions 1a and 1b may have a higher oxygen vacancy concentration than the remaining region. The oxygen vacancy may generate free electrons and increase a carrier concentration. The first and second regions 1a and 1b may have a higher nitrogen concentration, e.g., a higher nitrogen content than the remaining region. The first and second regions 1a and 1b may have a higher carrier concentration than that of the remaining region of the channel layer C1. For example, the first and second regions 1a and 1b may have a carrier concentration that is several dozen to several hundred times higher than that of the remaining region. Furthermore, the first and second regions 1a and 1b may have a lower electrical resistance than the remaining region. Thus, the contact resistances between the first region 1a and the source electrode S1 and between the second region 1b and the drain electrode D1 may be low. In other words, the contact resistance between the channel layer C1 and either the source or drain electrode S1 or D1 may be reduced by the first and second regions 1a and 1b.

An etch stop layer ES1 may be disposed on the channel layer C1. The source electrode S1 may extend above one end of the etch stop layer ES1 while contacting the first region 1a, and the drain electrode D1 may extend above the other end of the etch stop layer ES1 while contacting the second region 1b. The etch stop layer ES1 may limit (and/or prevent) damage to the underlying channel layer C1 during etching for forming the source and drain electrodes S1 and D1. For example, the etch stop layer ES1 may be formed of an inorganic dielectric material (e.g., silicon oxide or silicon nitride), or an organic insulating material. The first and second regions 1a and 1b may be located at both sides of the etch stop layer ES1. In this case, portions of the channel layer C1 at both sides of the etch stop layer ES1 may be plasma treated to thereby form the first and second regions 1a and 1b. In other words, the etch stop layer ES1 may serve as a mask for forming the first and second regions 1a and 1b in the channel layer C1. Thus, the first and second regions 1a and 1b may be defined by the etch stop layer ES1.

Thicknesses of the gate electrode G1 and the gate insulating layer Gl1 may be between about 50 nm and about 300 nm and between about 50 nm and about 400 nm, respectively. Thicknesses of the source and drain electrodes S1 and D1 may be between about 10 nm and about 200 nm. The thickness ranges are not limited thereto, but they may vary depending on the application.

A passivation layer (not shown) may be disposed on the gate insulating layer Gl1 so as to cover the etch stop layer ES1, the source electrode S1, and the drain electrode D1. The passivation layer may be a silicon oxide layer, a silicon oxynitride layer, a silicon nitride layer or an organic insulating layer, or be formed from a stack of at least two of the layers. The passivation layer may also have a thickness between about 50 nm and about 1,200 nm, but is not limited thereto.

Since contact characteristics between the channel layer C1 and the source/drain electrodes S1 and D1 may be improved due to the presence of the first and second regions 1a and 1b, a transistor according to example embodiments may have enhanced performance and operating characteristics. In particular, since a contact resistance between the channel layer C1 and the source/drain electrodes S1 and D1 may be reduced due to the first and second regions 1a and 1b, field effect mobility (μ) and subthreshold swing (S.S.) characteristics of the transistor may be improved. Also, drain voltage (Vd)-drain current (Id) output characteristic of the transistor may be improved.

When a metal oxynitride semiconductor is used as a material of a channel layer, reducing contact characteristics between the metal oxynitride semiconductor (channel layer) and source/drain electrodes may be desired. Due to a work function difference between the metal oxynitride semiconductor (channel layer) and a source electrode, an energy (potential) barrier may be generated therebetween to thereby increase their contact resistance. Increasing the contact resistance may hamper injection of carriers (electrons) from the source electrode into the metal oxynitride semiconductor (channel layer). A contact resistance between the metal oxynitride semiconductor (channel layer) and a drain electrode may also be increased. These factors may contribute to poor performance and operating characteristics of a transistor. However, in a transistor according to example embodiments, the first and second regions 1a and 1b, which are plasma treated regions, have a high carrier concentration. Thus, a width (thickness) of an energy barrier between the channel layer C1 and the source/drain electrodes S1 and D1 may be reduced by the first and second regions 1a and 1b, and a carrier (electron) flow characteristic may be increased due to tunneling effects. Due to the presence of the first and second regions 1a and 1b, the height of an energy barrier may also be reduced. Therefore, contact characteristics between the channel layer C1 and the source/drain electrodes S1 and D1 may be significantly improved. In this regard, a transistor (or a metal oxynitride thin film transistor) having excellent performance and operating characteristics may be provided.

Figure 2:
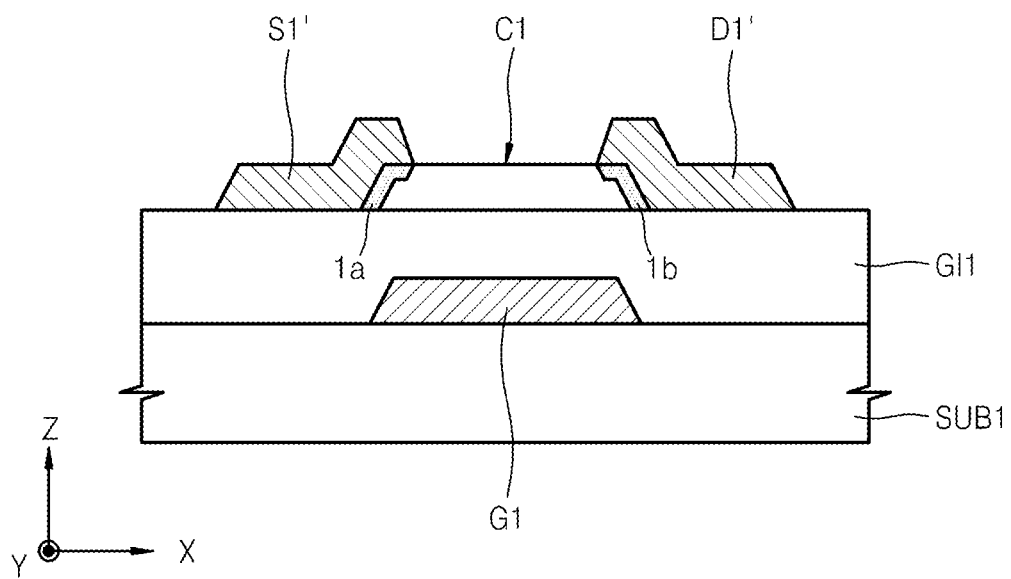

According to example embodiments, the etch stop layer ES1 of FIG. 1 may be omitted, as illustrated in FIG. 2.

Referring to FIG. 2, a source electrode S1' and a drain electrode D1' may be disposed so as to contact a first region 1a and a second region 1b of a channel layer C1, respectively. The source electrode S1' may extend to a portion of the channel layer C1 adjacent to the first region 1a. Similarly, the drain electrode D1' may extend to a portion of the channel layer C1 adjacent to the second region 1b. Except for the absence of the etch stop layer ES1 and the shape of the source electrode S1' and the drain electrode D1', the transistor of FIG. 2 may have a similar or identical structure to the transistor of FIG. 1.

When the etch stop layer is not used like in the transistor of FIG. 2, a separate mask layer may be used to define the first and second regions 1a and 1b. After forming the mask layer on the channel layer C1, portions of the channel layer C1 exposed at both sides of the mask layer may be plasma treated to thereby form the first and second regions 1a and 1b. Subsequently, the mask layer may be removed, and then, the source electrode S1' and the drain electrode D1' may be formed. Alternatively, the source electrode S1' and the drain electrode D1' may be formed before removal of the mask layer.

Figure 3:
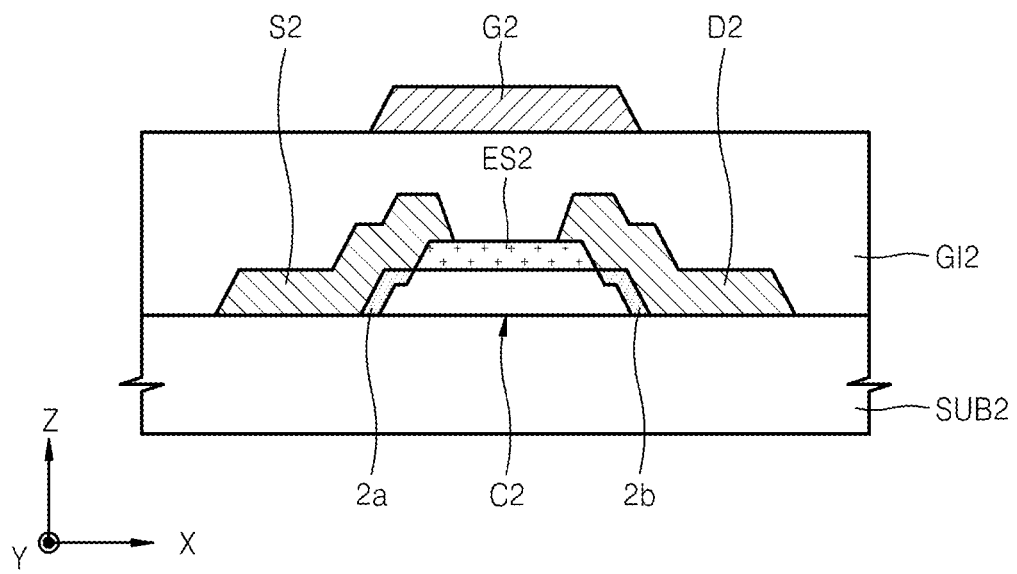

FIG. 3 illustrates a transistor according to example embodiments that may be a thin film transistor having a top gate structure in which a gate electrode G2 is disposed above a channel layer C2.

Referring to FIG. 3, the channel layer C2 may be disposed on the substrate SUB2. Like the channel layer C1 in FIG. 1, the channel layer C2 may include a metal oxynitride semiconductor such as a ZnON-based semiconductor. For example, the channel layer C2 may include ZnON or ZnON—X (X: additional element). The additional element X may contain at least one of cations of B, Al, Ga, In, Sn, Ti, Zr, Hf and Si, at least one of anions of F, Cl, Br, I, S and Se, or at least one of the cations and at least one of the anions.

An etch stop layer ES2 may be formed on the channel layer C2, and first and second regions 2a and 2b may be formed within the channel layer C2 at both sides of the etch stop layer ES2. A source electrode S2 and a drain electrode D2 may be disposed on the substrate SUB2 so as to contact the first and second regions 2a and 2b of the channel layer C2, respectively. The first and second regions 2a and 2b of the channel layer C2 may also have a lower oxygen concentration than that of the remaining region thereof. The first and second regions 2a and 2b of the channel layer C2 may have a higher oxygen vacancy concentration than that of the remaining region thereof. Also, the first and second regions 2a and 2b may have a higher nitrogen concentration than that of the remaining region. The first and second regions 2a and 2b may have higher carrier concentration and lower electrical resistance than the remaining region. Thus, according to example embodiments, the transistor including the first and second regions 2a and 2b may exhibit enhanced contact characteristics between the channel layer C2 and the source/drain electrodes S2 and D2.

A gate insulating layer Gl2 may be disposed on the substrate SUB2 to cover the channel layer C2, the source electrode S2, and the drain electrode D2. A gate electrode G2 may be disposed on the gate insulating layer Gl2. The transistor may further include a passivation layer (not shown) formed on the gate insulating layer Gl2 so as to cover the gate electrode G2.

The substrate SUB2, the channel layer C2, the etch stop layer ES2, the source electrode S2, the drain electrode D2, the gate insulating layer Gl2, and the gate electrode G2 may have the same or similar thicknesses and materials as their counterparts in the transistor of FIG. 1.

Figure 4:
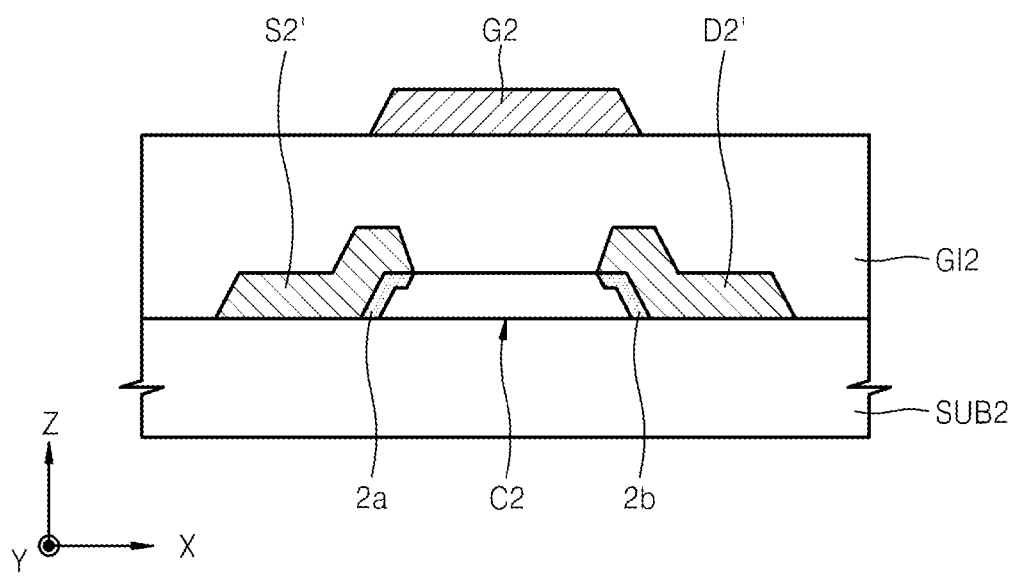

According to example embodiments, the etch stop layer ES2 may be omitted, as illustrated in FIG. 4.

Referring to FIG. 4, a source electrode S2' and a drain electrode D2' may be disposed so as to contact a first region 2a and a second region 2b of a channel layer C2, respectively. The source electrode S2' may extend to a portion of the channel layer C2 adjacent to the first region 2a. Similarly, the drain electrode D2' may extend to a portion of the channel layer C2 adjacent to the second region 2b. Except for the absence of the etch stop layer ES2 and the shape of the source electrode S2' and the drain electrode D2', the transistor of FIG. 4 may have a similar or identical structure to the transistor of FIG. 3.

Figure 5:
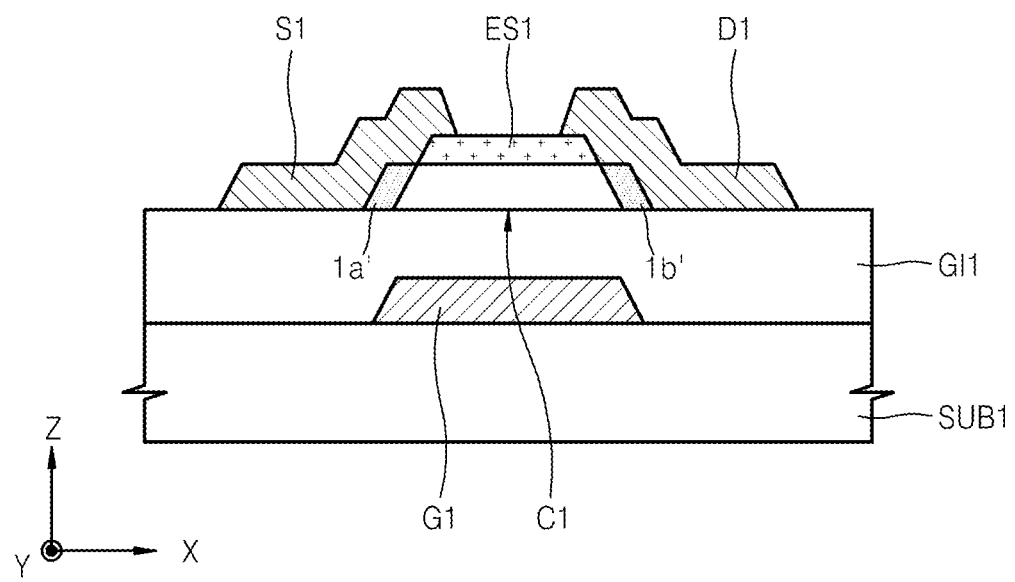

The first and second regions 1a and 1b or 2a and 2b may have different shapes than those shown in FIGS. 1 through 4. FIG. 5 illustrates a transistor according to example embodiments having a similar structure to the transistor of FIG. 1 except for the shape of first and second regions 1a' and 1 b'.

Referring to FIG. 5, the first and second regions 1a' and 1 b' may have a uniform (relatively uniform) thickness across a horizontal (X-axis) direction, compared to the first and second regions 1a and 1b having a bent shape following a profile of surface of an end of the channel layer C1. The first and second regions 1a' and 1b' may penetrate into the channel layer C1 more deeply than the first and second regions 1a and 1b shown in FIG. 1. The first and second regions 1a and 1b may have other shapes than the shape of the first and second regions 1a' and 1b' shown in FIG. 5.

FIGS. 6A through 6G are cross-sectional views illustrating a method of manufacturing a transistor according to example embodiments. In example embodiments, the transistor formed by the method illustrate in FIGS. 6A through 6G may be a thin film transistor having a bottom gate structure.

Figure 6A:
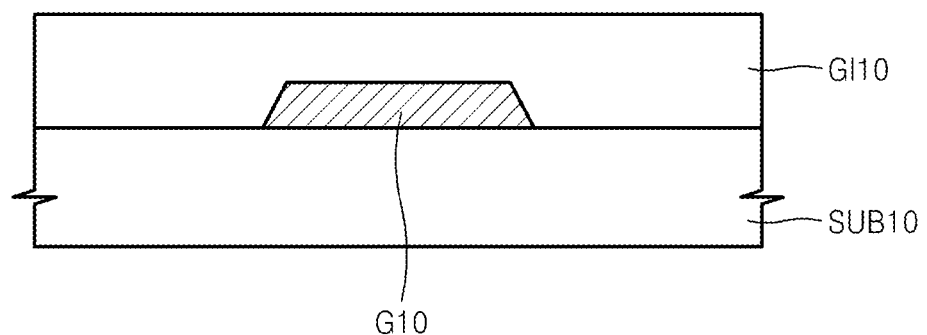
FIGS. 6A through 6G are cross-sectional views illustrating a method of manufacturing a transistor according to example embodiments.

Referring to FIG. 6A, a gate electrode G10 may be formed on a substrate SUB10, and a gate insulating layer Gl10 covering the gate electrode G10 may be formed on the substrate SUB10. The substrate SUB10 may be may be a glass substrate, a plastic substrate, or a semiconductor substrate (e.g., a silicon substrate), or one of various other substrates which are generally used in a semiconductor manufacturing process. The gate electrode G10 may be formed of a general electrode material such as a metal or a conductive oxide. The gate insulating layer Gl10 may be formed of silicon oxide, silicon oxynitride, silicon nitride, or other materials such as a high dielectric constant material with a dielectric constant which is higher than that of silicon nitride. The gate insulating layer Gl10 may be formed from a stack of at least two of a silicon oxide layer, a silicon oxynitride layer, a silicon nitride layer, and a high dielectric constant material layer.

Figure 6B:
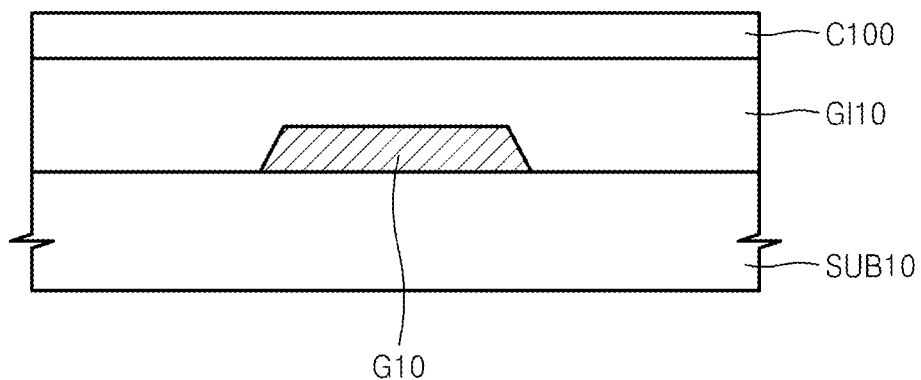

Referring to FIG. 6B, a semiconductor layer C100 for a channel may be formed on the gate insulating layer Gl10. The semiconductor layer C100 for a channel may be formed of a metal oxynitride semiconductor such as a ZnON-based semiconductor. For example, the semiconductor layer C100 may be formed of ZnON or ZnON—X (X: additional element). The additional element X may contain at least one of cations of B, Al, Ga, In, Sn, Ti, Zr, Hf and Si, or contain at least one of anions of F, Cl, Br, I, S and Se, or contain at least one of the cations and at least one of the anions. Some examples of ZnON—X containing the at least one cation are ZnON—Al, ZnON—Ga, ZnON—Hf, and ZnON—Si. Some examples of ZnON—X containing the at least one anion are ZnON—F and ZnON—Cl. The additional element X in the ZnON—X may be a dopant. The semiconductor layer C100 for a channel may be amorphous or crystalline, or may have a structure that includes a mixture of amorphous and crystalline phases. The semiconductor layer C100 for a channel may have a thickness in the range of about 5 nm to about 150 nm, and in particular, in the range of about 10 nm to about 100 nm. However, an appropriate thickness range of the semiconductor layer C100 for a channel may vary.

For example, the semiconductor layer C100 for a channel may be deposited by a physical vapor deposition (PVD) method such as reactive sputtering. When the semiconductor layer C100 for a channel is formed of ZnON—X (X: additional element), the reactive sputtering may be performed by co-sputtering using a Zn target and a target containing the element X. Alternatively, the reactive sputtering may be performed with a single target containing both Zn and the element X, such as a Zn—X alloy target. When the semiconductor layer C100 for a channel is formed of ZnON, a single Zn target may be used in the reactive sputtering. The reactive sputtering may use $O_2$ and $N_2$ as reactive gases. In this case, the flow rate of the $O_2$ gas may be in the range of about 1 to about 15 sccm. The flow rate of the $N_2$ gas may be in the range of about 20 to about 200 sccm. In the reactive sputtering, argon (Ar) gas may also be used to generate plasma. In this case, the flow rate of the Ar gas may be in the range of about 1 to about 100 sccm. By generating plasma from the Ar gas, a deposition efficiency may be increased. The reactive sputtering may be carried out at a temperature of about 25° C. to about 300° C. In other words, when the semiconductor layer C100 for a channel is formed by the reactive sputtering, the substrate SUB10 may be maintained at a temperature of about 25° C. to about 300° C. The method of forming the semiconductor layer C100 for a channel described above may be an example only, and the semiconductor layer C100 for a channel may be formed by other methods. For example, the semiconductor layer C100 for a channel may be formed by methods other than the reactive sputtering, such as metal organic chemical vapor deposition (MOCVD), chemical vapor deposition (CVD), atomic layer deposition (ALD), or evaporation.

Figure 6C:
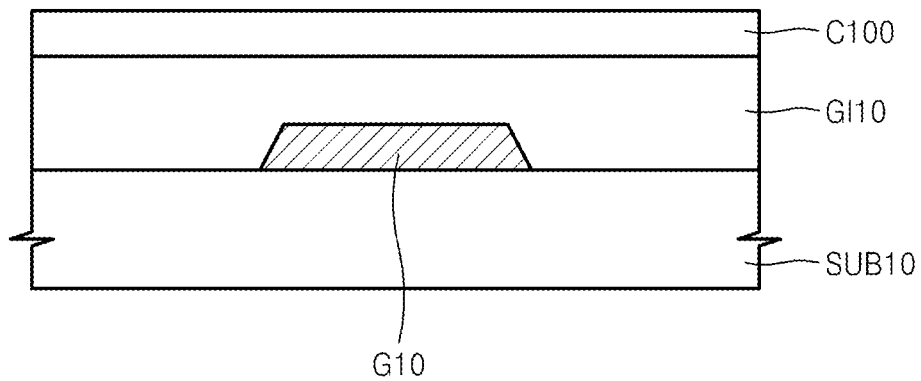

Referring to FIG. 6C, annealing (e.g., heat treatment) may be performed on the semiconductor layer C100 for a channel. The annealing may be referred to as 'first annealing'. The first annealing may be performed at about 150° C. to 350° C. The first annealing may be performed in an $N_2$, $O_2$, or air atmosphere. By the first annealing, the semiconductor layer C100 for a channel may be stabilized. When the semiconductor layer C100 for a channel is made of a ZnON-based semiconductor, the ZnON-based semiconductor may react with moisture and so on to undergo deterioration. In order to limit (and/or prevent) deterioration of the ZnON-based semiconductor, the first annealing may be carried out to stabilize the semiconductor layer C100 for a channel. By performing the first annealing, a thin protection layer (not shown) may be formed on a surface of the semiconductor layer C100 for a channel, and the overall physical properties of the semiconductor layer C100 for a channel may be stabilized.

Figure 6D:
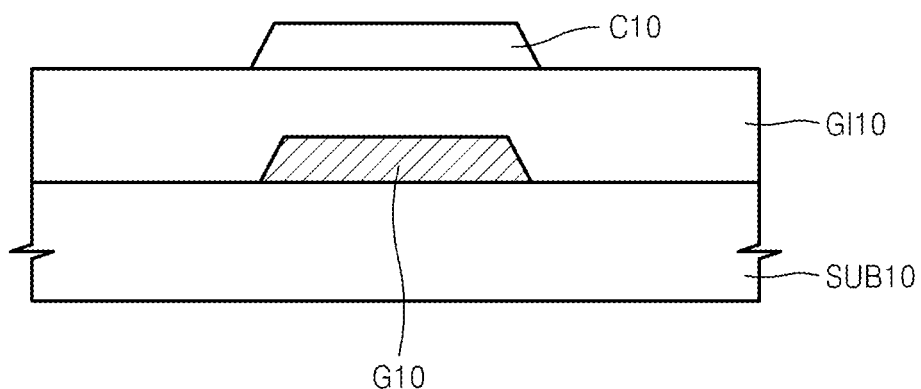

The semiconductor layer C100 for a channel may be patterned to form a channel layer C10 as shown in FIG. 6D. Referring to FIG. 6D, the channel layer C10 may be disposed on a portion of the gate electrode Gl10 corresponding to the underlying gate electrode G10, so as to face the gate electrode G10.

Figure 6E:
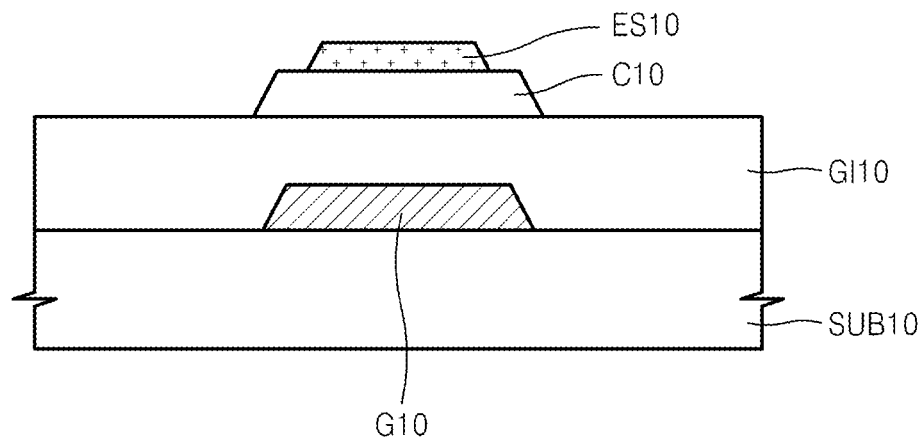

Referring to FIG. 6E, an etch stop layer ES10 may be formed on the channel layer C10. The etch stop layer ES10 may be formed on a central portion (or an adjacent region thereto) of the channel layer C10. Thus, portions of the channel layer C10 at both sides of the etch stop layer ES10 may be not be exposed. The etch stop layer ES10 may be formed of an inorganic dielectric material (e.g., silicon oxide, silicon nitride, or the like), and/or an organic insulating material, or the like.

Figure 6F:
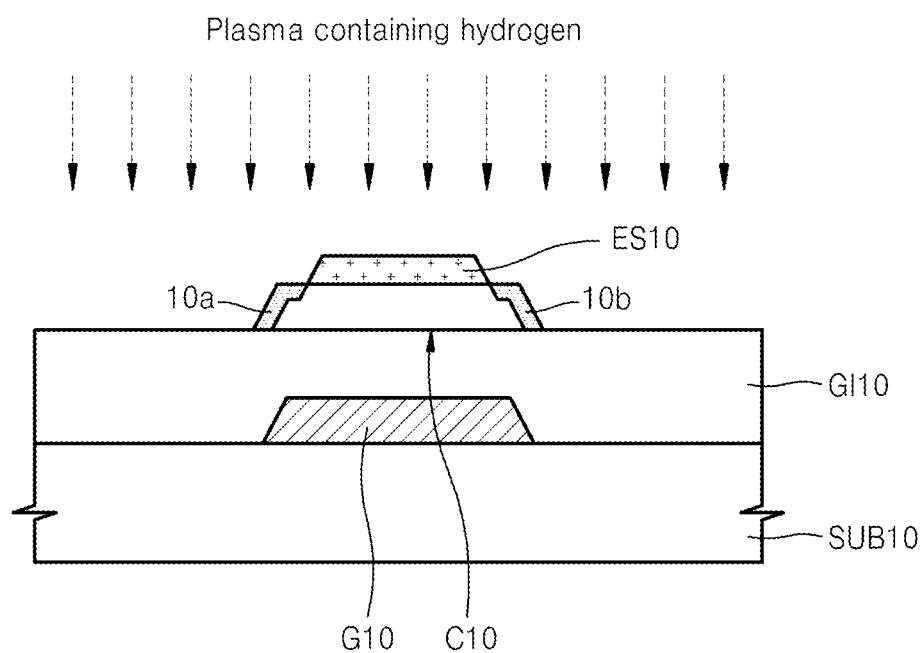

Referring to FIG. 6F, by using the etch stop layer ES10 as a mask, the exposed portions of the channel layer C10 may be subjected to plasma treatment to thereby form in the channel layer C10 plasma treated regions, e.g., first and second regions 10a and 10b. The plasma treatment may be performed using a hydrogen-containing gas. For example, the hydrogen-containing gas may include one of ammonia ($NH_3$), hydrogen ($H_2$), silane ($SiH_4$), and a mixture thereof. The plasma treatment may be performed at about 20° C. to about 350° C., which may mean that the substrate SUB10 is maintained at about 20° C. to about 350° C. The plasma treatment may be performed for several seconds to several minutes. The first and second regions 10a and 10b subjected to the plasma treatment may contain hydrogen atoms. The hydrogen atoms may function as a carrier donor to increase a carrier concentration. The first and second regions 10a and 10b of the channel layer C10 may have a lower oxygen concentration than that of the remaining region thereof. In other words, the first and second regions 10a and 10b may have a lower oxygen content than that of the remaining region. The first and second regions 10a and 10 may have a higher oxygen vacancy concentration than the remaining region. The oxygen vacancy may generate free electrons to increase a carrier concentration. The first and second regions 10a and 10b may also have a higher nitrogen concentration, e.g., a higher nitrogen content, than the remaining region. The first and second regions 10a and 10b may have a higher carrier concentration than that of the remaining region. The first and second regions 10a and 10b may have a carrier concentration that is several dozen to several hundred times higher than that of the remaining region. For example, if the channel layer C10 is formed of ZnON, and $NH_3$ plasma is used to form the first and second regions 10a and 10b, the first and second regions 10a and 10b may have a carrier concentration of about $10^{19}$/cm³ which is about 100 times higher than a carrier concentration (about $10^{17}$/cm³) of the remaining region not treated with plasma. Furthermore, the first and second regions 10a and 10b may have a lower electrical resistance than the remaining region.

Figure 6G:
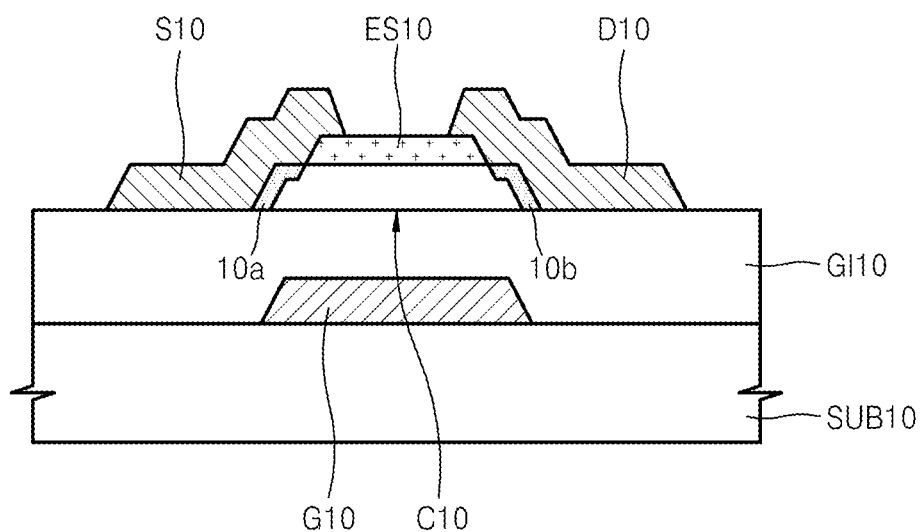

Referring to FIG. 6G, a source electrode S10 and a drain electrode D10 may be formed on the gate insulating layer Gl10 so as to contact the first and second regions 10a and 10b, respectively. The source electrode S10 may contact the first region 10a and extend above one end of the etch stop layer ES10 while the drain electrode D10 may contact the second region 10b and extend above the other end of the etch stop layer ES10. A desired (and/or alternatively predetermined) conductive layer may be formed on the gate insulating layer Gl10 so as to cover the channel layer C10 and the etch stop layer ES10 and may be patterned (etched) to thereby form the source electrode S10 and the drain electrode D10. In this case, the etch stop layer ES10 may limit (and/or prevent) damage to the underlying channel layer C10 during etching for forming the source and drain electrodes S10 and D10. The source and drain electrodes S10 and D10 may be formed of the same material as or different materials than the gate electrode G10. Each of the source and drain electrodes S10 and D10 may have a single- or multi-layer structure. For example, each of the source and drain electrodes S10 and D10 may include a metal such as Al, Nd, Cr, Cu, Ta, Ti, Mo, W, Au, or Ag, and an alloy thereof. Alternatively, the source or drain electrode S10 or D10 may include a transparent conductive oxide (TCO) such as ITO, IZO, AZO, GZO, or ZTO, and an alloy thereof.

Contact characteristics between the channel layer C10 and the source/drain electrodes S10 and D10 may be improved due to the presence of the first and second regions 10a and 10b. In other words, a contact resistance therebetween may be reduced due to the first and second regions 10a and 10b.

Next, subsequent annealing may be performed on the resultant structure (e.g., the transistor). The subsequent annealing may be referred to as second annealing. The second annealing may be performed at about 150 to 350. The second annealing may be performed in an $N_2$, $O_2$, or air atmosphere.

A passivation layer (not shown) may be formed on the gate insulating layer Gl10 so as to cover the etch stop layer ES10, the source electrode S10, and the drain electrode D10. The passivation layer may be a silicon oxide layer, a silicon oxynitride layer, a silicon nitride layer or an organic insulating layer, or be formed from a stack of at least two of these layers. The second annealing may be performed before or after formation of the passivation layer.

FIGS. 6A through 6G illustrate an example of the method for manufacturing the transistor of FIG. 1 according to example embodiments. This method may be modified to manufacture the transistor of FIG. 2. For example, in the operation illustrated in FIG. 6E, a mask layer having the same (or similar) shape as the etch stop layer ES10 may be formed instead of the etch stop layer ES10. Then, like in the operation illustrated in FIG. 6F, exposed portions of the channel layer C10 at both sides of the mask layer may be plasma treated to form the first and second regions 10a and 10b, followed by removal of the mask layer. A source electrode and a drain electrode may be then formed so as to contact the first and second regions 10a and 10b, respectively, thereby manufacturing the transistor of FIG. 2. In this case, the mask layer may be formed of a photosensitive material or a general insulating (dielectric) material. Furthermore, depending on the plasma treatment conditions described with reference to FIG. 6F, the shape of the first and second regions 10a and 10b may vary. Thus, by adjusting the plasma treatment conditions, the structure of the transistor shown in FIG. 5 may be obtained. Other modifications may be made to the method of manufacturing the transistor shown in FIGS. 6A through 6G.

FIGS. 7A through 7D are cross-sectional views illustrating a method of manufacturing a transistor according to example embodiments. The transistor is a thin film transistor having a top gate structure.

Figure 7A:
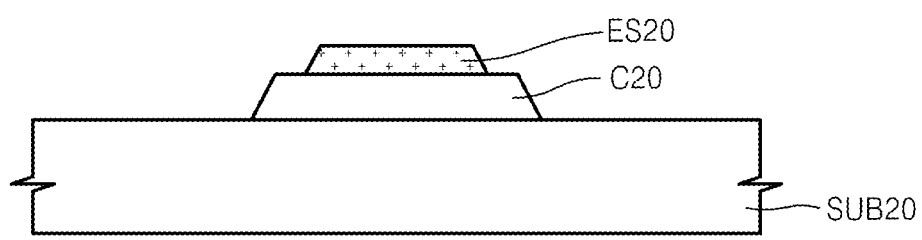
FIGS. 7A through 7D are cross-sectional views illustrating a method of manufacturing a transistor according to example embodiments.

Referring to FIG. 7A, a channel layer C20 may be disposed on a substrate SUB20, and an etch stop layer ES20 may be formed on the channel layer C20. The channel layer C20 may be formed in the same or similar manner as described with reference to FIGS. 6B through 6D. Thus, the channel layer C20 may include a metal oxynitride semiconductor such as a ZnON-based semiconductor. The etch stop layer ES20 may be formed in the same or similar manner as described with reference to FIG. 6E.

Figure 7B:
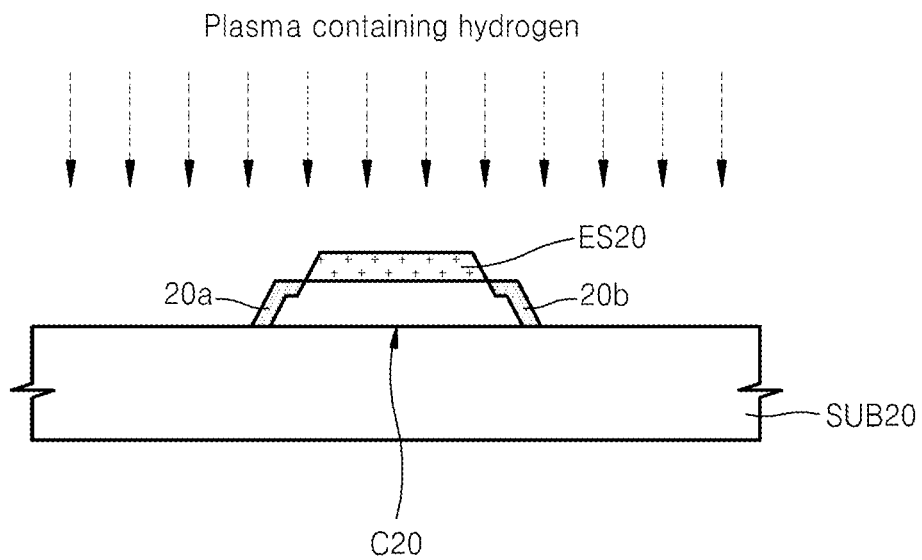

Referring to FIG. 7B, portions of the channel layer C20 exposed at either side of the etch stop layer ES20 may be subjected to a plasma treatment to thereby form first and second regions 20a and 20b. In this case, the plasma treatment may be performed in the same or similar manner as described with reference to FIG. 6F. More specifically, the plasma treatment may be carried out at about 20° C. to about 350° C. by using a hydrogen-containing gas such as $NH_3$, $H_2$, $SiH_4$, or mixtures thereof. The first and second regions 20a and 20b formed in the channel layer C20 by the plasma treatment may have the same characteristics as the first and second regions 10a and 10b illustrated in FIG. 6F.

Figure 7C:
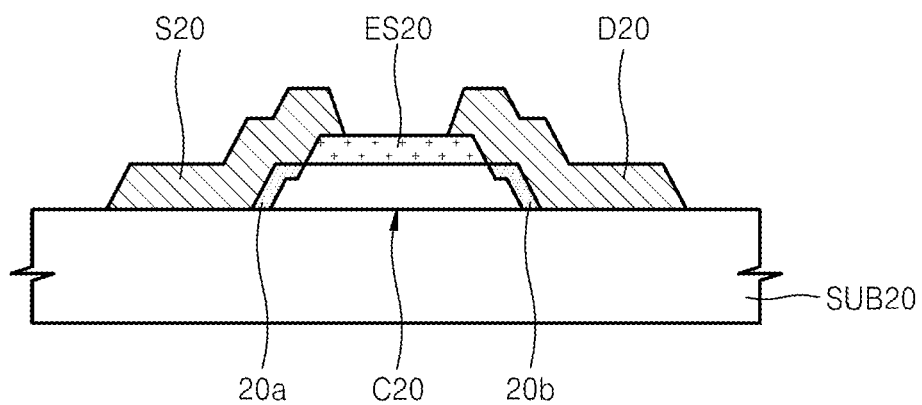

Referring to FIG. 7C, a source electrode S20 and a drain electrode D20 may be formed on the substrate SUB20 so as to contact the first and second regions 20a and 20b, respectively. The source electrode S20 and the drain electrode D20 may be formed of the same or similar material and in the same or similar manner as those for the source S10 and the drain electrode D10 described with reference to FIG. 6G.

Figure 7D:
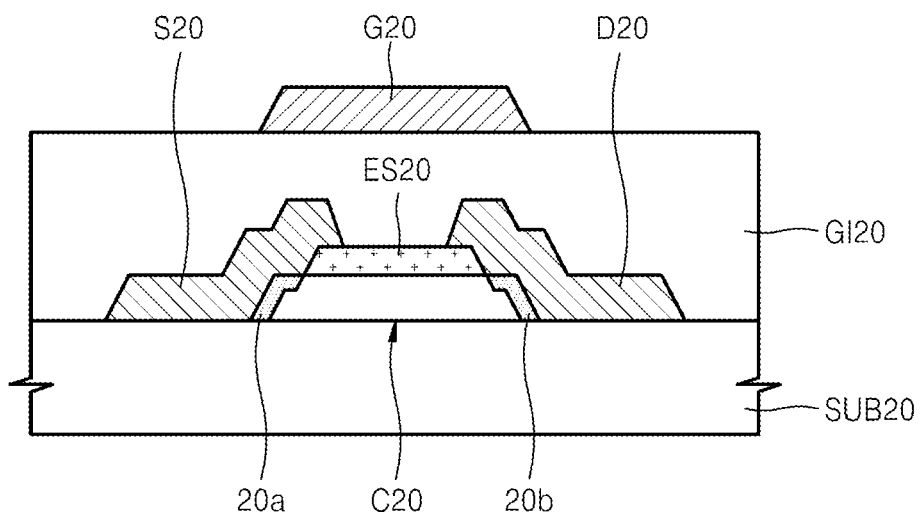

Referring to FIG. 7D, a gate insulating layer Gl20 may be formed over the substrate SUB20 so as to cover the source electrode S20, the drain electrode D20, and the etch stop layer ES20 exposed between the source and drain electrodes S20 and D20. A gate electrode G20 may be formed of the gate insulating layer Gl20. The gate electrode G20 may be disposed above the channel layer C20. The gate insulating layer Gl20 and the gate electrode G20 may be formed of the same or similar materials and in the same or similar manners as those for the gate insulating layer Gl10 and the gate electrode G10 described with reference to FIG. 6A.

Next, subsequent annealing may be performed on the resulting structure (e.g., the transistor) in the same or similar manner as the subsequent annealing (e.g., the second annealing) described with reference to FIG. 6G. A passivation layer (not shown) may be further formed on the gate insulating layer Gl20 so as to cover the gate electrode G20. The passivation layer may be a silicon oxide layer, a silicon oxynitride layer, a silicon nitride layer or an organic insulating layer, or be formed from a stack of at least two of these layers. The subsequent annealing may be performed before or after formation of the passivation layer.

FIGS. 7A through 7D illustrate an example of a method according to example embodiments for manufacturing the transistor of FIG. 3. This method may be modified to manufacture the transistor of FIG. 4. Because the method of manufacturing the transistor of FIG. 4 will be apparent to those of ordinary skill in the art upon reading the method described with reference to FIGS. 7A through 7D, a detailed description thereof is omitted herein.

FIG. 8(A) and FIG. 8(B) are graphs illustrating transfer characteristics (gate voltage Vg-drain current Id) of a transistor according to a comparative example and a transistor according to example embodiments, respectively. Although the transistor according to the comparative example may have a similar structure to that shown in FIG. 1, it may not include the first and second regions 1a and 1b that are plasma treated regions. In other words, in the transistor according to the comparative example, a source electrode and a drain electrode are formed without performing plasma treatment on two ends of a channel layer. A transistor according to example embodiments may have the same structure as the transistor of FIG. 1 with the first and second regions 1a and 1b being treated with $NH_3$ plasma for about 20 seconds. The channel layers in the transistor according to the comparative example and a transistor according to example embodiments are formed of ZnON—Ga, e.g., GaZnON.

As can be observed from FIG. 8(A) and FIG. 8(B), a transistor according to example embodiments using the plasma treatment may exhibit excellent field effect mobility ($\mu$) and subthreshold swing (S.S.) characteristics compared to the transistor according to the comparative example without the plasma treatment. This is considered to be due to improvement of contact characteristics between a channel layer and source/drain electrodes using the plasma treatment. In other words, by using the first and second regions 1a and 1b as shown in FIG. 1, contact characteristics between the channel layer C1 and the source/drain electrodes S1 and D1 may be improved, and thus the performance and operating characteristics of the transistor may be enhanced.

Figure 8:
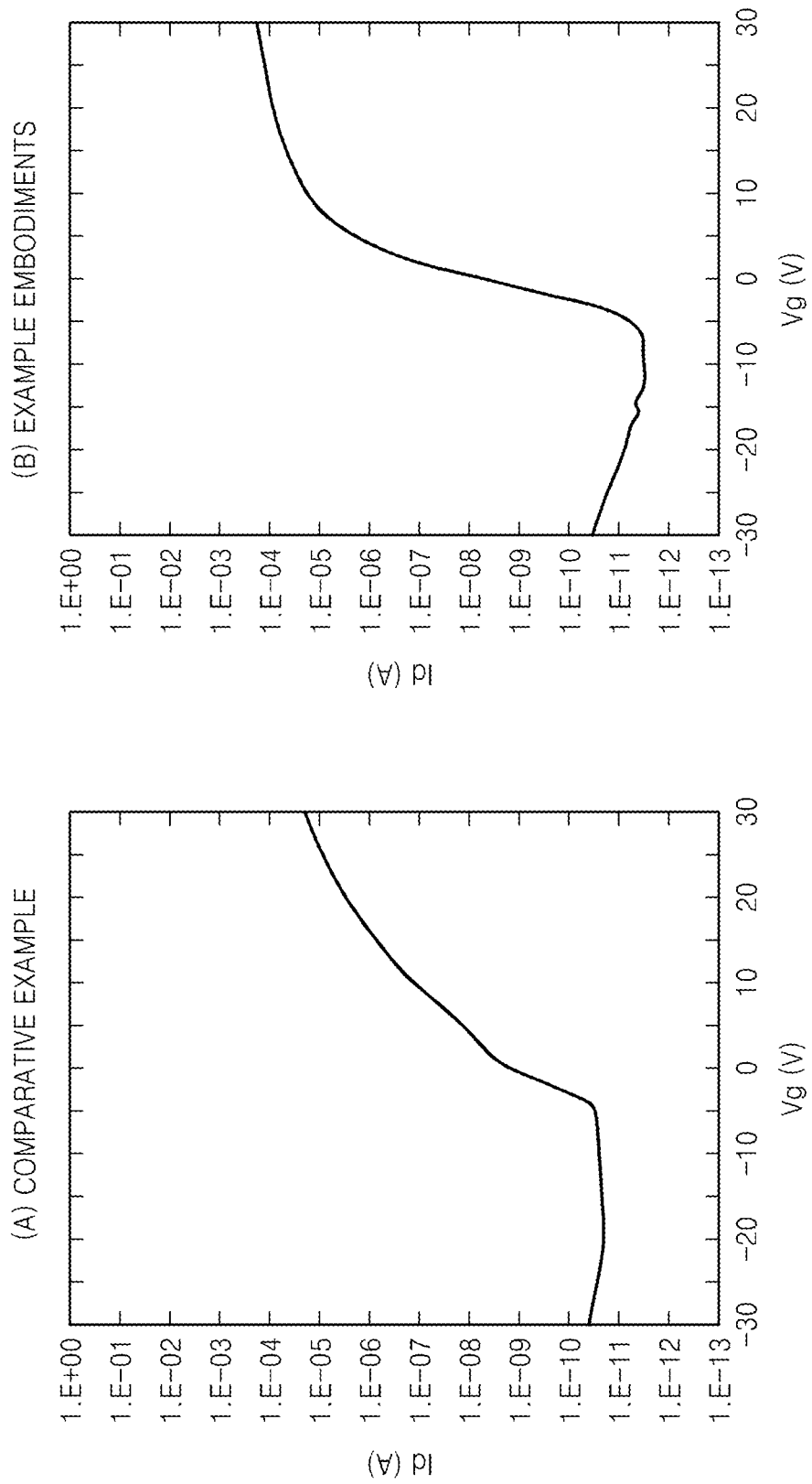
FIG. 8(A) and FIG. 8(B) are graphs illustrating transfer characteristics (gate voltage (Vg)-drain current (Id)) of a transistor according to a comparative example and a transistor according to example embodiments, respectively.

Table 1 shows physical properties of the transistor according to the comparative example and a transistor according to example embodiments calculated from the transfer characteristics illustrated in FIG. 8.

TABLE 1

| | Field effect mobility ($\mu$) [$cm^2$/Vs] | Subthreshold swing (S.S.) [V/dec] |
|---|---|---|
| Comparative Example (A) | 9.38 ± 1.31 | 1.96 ± 0.16 |
| Example Embodiments (B) | 28.22 ± 0.93 | 1.26 ± 0.03 |

As evident from Table 1, the transistor according to example embodiments possesses a field effect mobility ($\mu$) which is about 3 times higher than that of the comparative example. A transistor according to example embodiments has a subthreshold swing (S.S.), e.g., a subthreshold slope which is about 1.5 times less than that of the comparative example. This means that a transistor according to example embodiments may have excellent field effect mobility ($\mu$) and subthreshold swing (S.S.) characteristics compared to the comparative example.

Figure 9:
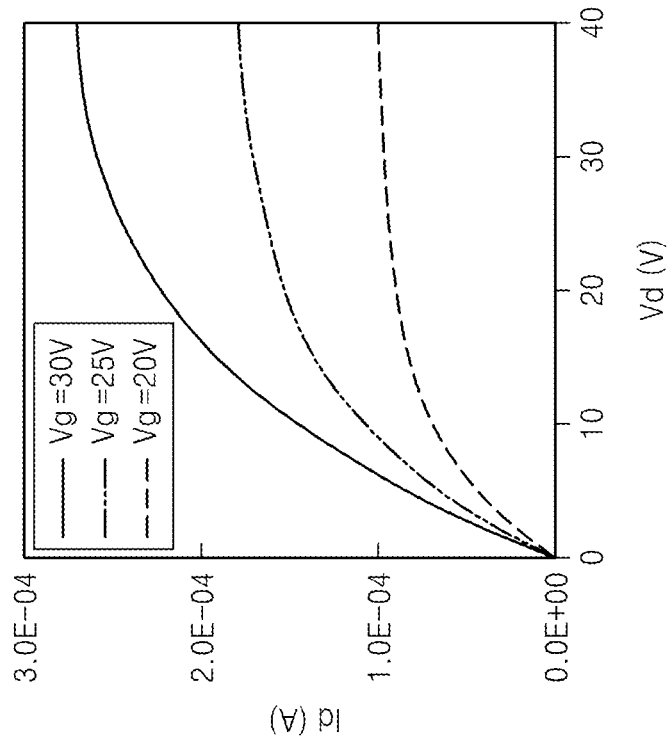
FIG. 9(A) and FIG. 9(B) are graphs illustrating output characteristics (drain voltage (vd)-drain current (Id)) of a transistor according to a comparative example and a transistor according to example embodiments, respectively.
Figure 9:
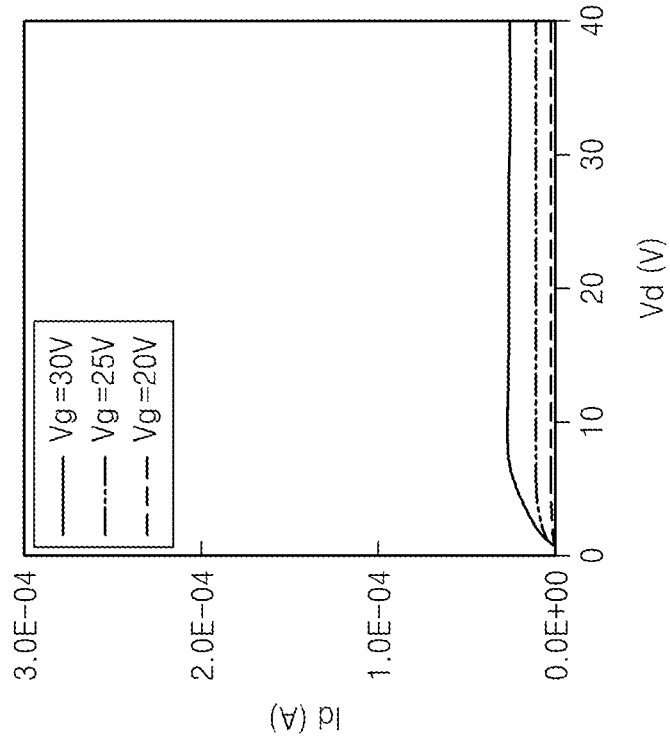

FIG. 9(A) and FIG. 9(B) are graphs illustrating output characteristics (drain voltage Vd-drain current Id) of a transistor according to a comparative example and a transistor according to example embodiments, respectively. The transistor according to the comparative example and a transistor according to example embodiments in FIG. 9 have the same structures as counterparts in FIG. 8. The output characteristics illustrated in (A) and (B) of FIG. 9 are measured at gate voltages Vg of 20V, 25V, and 30V, respectively.

Referring to FIG. 9, according to example embodiments, the transistor shows excellent output characteristics (drain voltage Vd-drain current Id) compared to the transistor according to the comparative example. In other words, the transistor according to example embodiments exhibits a significantly high drain current Id at the same gate voltage Vg compared to the transistor according to the comparative example. It can be seen from FIG. 9 that the performance and operating characteristics of the transistor according to example embodiments may be significantly enhanced by improving characteristics between a channel layer and source/drain electrodes using plasma treatment.

Transistors according to example embodiments may be used as switching devices or driving devices for flat panel displays such as liquid crystal display device or organic light-emitting display device. In particular, transistors according to example embodiments may be applied to next-generation high-resolution flat panel displays such as active matrix liquid crystal display (AMLCD) and active matrix organic light emitting diode (AMOLED) for delivering ultra high definition (UHD) images. As described above, since transistors according to example embodiments have excellent performance and operating characteristics, the use of the transistors in the flat panel displays may improve the performances of the flat panel displays. Furthermore, the transistors according to example embodiments may be used for various applications in the field of electronic appliances such as memory devices and logic devices as well as flat panel displays.

Figure 10:
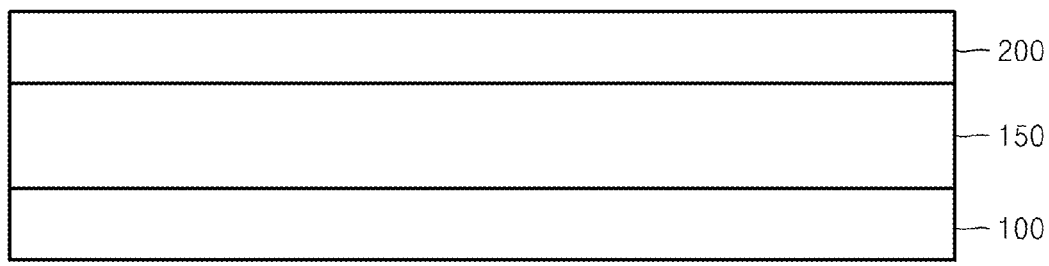
FIG. 10 is a cross-sectional view of an electronic device (flat panel display) including a transistor according to example embodiments.

FIG. 10 is a cross-sectional view of an electronic device (flat panel display) including a transistor according to example embodiments. The electronic device (flat panel display) according to the present embodiment is a liquid crystal display.

Referring to FIG. 10, a liquid crystal layer 150 may be sandwiched between first and second substrates 100 and 200. The first substrate 100 may be an array substrate including a transistor, e.g., at least one of the transistors of FIGS. 1 through 5 as a switching or driving element. The first substrate 100 may include a pixel electrode (not shown) connected to the transistor. The second substrate 200 may include a counter electrode (not shown) corresponding to the pixel electrode. Depending on a voltage applied to the first and second substrates 100 and 200, liquid crystals in the liquid crystal layer 150 may be aligned in different directions. The electronic device including the transistor according to example embodiments is not limited thereto, but it may various other structures.

It should be understood that example embodiments described herein should be considered in a descriptive sense only and not for purposes of limitation. It will also be understood by those of ordinary skill in the art that various changes in components and structures may be made in the transistors of FIGS. 1 through 5. For example, the channel layer may have a multi-layer structure including a plurality of layers, one of which is the metal oxynitride semiconductor layer. The transistors according to the example embodiments may also have a double gate structure. Various modifications will be made to the methods of manufacturing a transistor illustrated in FIGS. 6A through 6G and FIGS. 7A through 7D.

While some example embodiments have been particularly shown and described, it will be understood by one of ordinary skill in the art that variations in form and detail may be made therein without departing from the spirit and scope of the claims.

What is claimed is:

1. A transistor comprising:
   a gate electrode, a gate insulating layer, and a channel layer stacked on each other,
      the channel layer facing the gate electrode,
      the channel layer including metal oxynitride,
      the channel layer including first and second regions that are plasma treated regions and have a higher carrier concentration than a carrier concentration in a remaining region of the channel layer,
      the gate insulating layer between the channel layer and the gate electrode; and
   a source electrode and a drain electrode contacting the first and second regions of the channel layer, respectively, wherein
   an oxygen concentration of the first and second regions of the channel layer is less than an oxygen concentration than that of the remaining region of the channel layer.

2. The transistor of claim 1, wherein the first and second regions of the channel layer are treated with a plasma containing hydrogen.

3. The transistor of claim 1, wherein the first and second regions of the channel layer contain hydrogen.

4. The transistor of claim 1, wherein a nitrogen concentration of the first and second regions of the channel layer is higher than a nitrogen concentration of the remaining region.

5. The transistor of claim 1, wherein the metal oxynitride of the channel layer includes a zinc oxynitride (ZnON)-based semiconductor.

6. The transistor of claim 5, wherein
   the ZnON-based semiconductor further includes an element X, and
   X includes at least one of at least one cation, at least one anion, and a combination of the at least one cation and the at least one anion,
   the at least one cation including at least one of boron (B), aluminum (Al), gallium (Ga), indium (In), tin (Sn), titanium (Ti), zirconium (Zr), hafnium (Hf) and silicon (Si),
   the at least one anion including at least one of fluorine (F), chlorine (Cl), bromine (Br), iodine (I), sulphur (S) and selenium (Se).

7. The transistor of claim 1, further comprising:
   an etch stop layer on the channel layer,
   wherein the first and second regions of the channel layer are located at both sides of the etch stop layer.

8. The transistor of claim 1, wherein the gate electrode is one of below and above the channel layer.

9. A flat panel display comprising:
   the transistor of claim 1.

* * * * *